United States Patent [19]

Olson et al.

[11] Patent Number: 5,738,267
[45] Date of Patent: Apr. 14, 1998

[54] APPARATUS AND METHOD FOR REMOVING KNOWN GOOD DIE USING HOT SHEAR PROCESS

[75] Inventors: David Charles Olson, Poughkeepsie; Robert Phillips, III, Staatsburg, both of N.Y.

[73] Assignee: International Business Machines Corporation, Armonk, N.Y.

[21] Appl. No.: 733,585

[22] Filed: Oct. 18, 1996

Related U.S. Application Data

[60] Continuation of Ser. No. 462,369, Jun. 5, 1995, Pat. No. 5,636,781, which is a division of Ser. No. 315,319, Sep. 29, 1994, Pat. No. 5,556,024.

[51] Int. Cl.$^6$ ............................................. B23K 3/00
[52] U.S. Cl. ..................... 228/13; 228/44.7; 228/19
[58] Field of Search ................. 228/19, 49.5, 191, 228/264, 212, 213, 44.7, 13; 269/9, 46, 285, 329, 703

[56] References Cited

U.S. PATENT DOCUMENTS

| | | | |
|---|---|---|---|
| 3,834,605 | 9/1974 | Coffin | 228/20 |
| 4,360,142 | 11/1982 | Carpenter et al. | 228/123 |
| 4,360,960 | 11/1982 | Patel | 29/426.5 |
| 4,526,859 | 7/1985 | Christensen et al. | 430/314 |
| 4,529,172 | 7/1985 | Le Comte | 269/207 |
| 4,561,584 | 12/1985 | Hug | 228/19 |
| 4,637,542 | 1/1987 | Breske et al. | 228/264 |
| 4,740,099 | 4/1988 | Philipoussi | |
| 4,767,047 | 8/1988 | Todd et al. | 228/6.2 |
| 4,894,910 | 1/1990 | Reimer et al. | 29/764 |
| 4,962,878 | 10/1990 | Kent | 228/54 |
| 5,007,163 | 4/1991 | Pope et al. | 29/840 |
| 5,054,681 | 10/1991 | Kim | 228/191 |
| 5,148,968 | 9/1992 | Schmidt et al. | 228/19 |
| 5,170,930 | 12/1992 | Dolbear et al. | 228/123 |
| 5,173,451 | 12/1992 | Kinsman et al. | 437/209 |
| 5,197,720 | 3/1993 | Renz et al. | 269/48.1 |
| 5,219,520 | 6/1993 | Borfman et al. | 419/35 |
| 5,237,269 | 8/1993 | Aimi et al. | 324/158 |
| 5,284,286 | 2/1994 | Brofman et al. | 228/19 |
| 5,447,596 | 9/1995 | Hayase | 269/21 |

FOREIGN PATENT DOCUMENTS

| | | |
|---|---|---|
| 104289 | 8/1977 | Japan. |
| 63-114221 | 5/1988 | Japan. |

OTHER PUBLICATIONS

IBM Technical Disclosure Bulletin, vol. 35, No. 4A, pp. 25–27 (Sep. 1992).
IBM Technical Disclosure Bulletin, vol. 33, No. 10A, pp. 43–44 (Mar. 1991).
IBM Technical Disclosure Bulletin, vol. 29, No. 12, pp. 5213–5214 (May 1987).
IBM Technical Disclosure Bulletin, vol. 29, No. 6, pp. 2784–2785 (Nov. 1986).
IBM Technical Disclosure Bulletin, vol. 32, No. 10A, p. 195 (Mar. 1990).
IBM Technical Disclosure Bulletin, vol. 36, No. 3, pp. 229–231 (Mar. 1990).
IBM Technical Disclosure Bulletin, vol. 34, No. 8, pp. 401–404 (Jan. 1992).
Research Disclosure, "Individual Chip Separation Device", Kenneth Mason Publications, No. 329 (32921), Sep. 1991.
Research Disclosure, "Novel Solder Array Module Rework/Tool", Kenneth Mason Publications, No. 330 (330110), Oct. 1991.

*Primary Examiner*—Samuel M. Heinrich
*Attorney, Agent, or Firm*—Aziz M. Ahsan

[57] ABSTRACT

Apparatus and method is provided for separating electrical connections, such as, solder connections, between two surfaces in which electrical connections are relatively weak and thus can be readily separated. The preferred application of the disclosed process and apparatus is its use in separating semiconductor devices from its device carrier after the devices have been through burn-in tests. The unique process and apparatus allows multiple uses of device carrier for testing and/or burning-in devices.

8 Claims, 2 Drawing Sheets

APPARATUS AND METHOD FOR REMOVING KNOWN GOOD DIE USING HOT SHEAR PROCESS

CROSS-REFERENCE TO RELATED PATENT APPLICATIONS

This Patent Application is a Continuation Patent Application of U.S. patent application Ser. No. 08/462,369, filed on Jun. 5, 1995, now U.S. Pat. No. 5,636,781, which was a Divisional Patent Application of U.S. patent application Ser. No. 08/315,319, filed on Sep. 29, 1994, now U.S. Pat. No. 5,556,024.

FIELD OF THE INVENTION

The present invention relates to structure and processes for separating two elements or surfaces from each other. More specifically, the present invention relates to separating an integrated circuit chip from its carrier, typically after a burn-in test. This inventive process and apparatus however could also be used to separate a chip from a substrate. This method and apparatus allows the re-use of the chip and the substrate as neither the chip nor the substrate or the chip carrier are mechanically or electrically damaged by the process and/or apparatus of this invention.

BACKGROUND OF THE INVENTION

As technology has evolved, semiconductor devices have become smaller and more dense, which has resulted in corresponding increases in overall chip failure rates, which in turn results in uncompetitive situations for chip manufacturers. There is therefore a need and desire by manufacturers of chips and semiconductor devices to be able to readily identify and eliminate the use of defective chips before the defective chips are finally mounted in a product.

Burn-in processes have evolved and have been developed in an effort to identify and eliminate the use of defective chips. During the burn-in process, normally a chip carrier is provided for testing the chips. The chip carrier has electrical contacts which correspond to the electrical contacts on the semiconductor chip. It is desirable for the carrier contacts to be mechanically weak but strong enough for holding the semiconductor chip in place during testing and to maintain good electrical connections. The chip is normally positioned on the chip carrier so that the electrical contacts, e.g., solder balls, on the chip are aligned with the corresponding contacts on the carrier and then the solder balls are partially reflowed to make electrical connections between the chip and the carrier.

It is therefore desirable to provide for the easy removal of the chip from the chip carrier after the burn-in test so that defective chips can be discarded or used elsewhere and good chips can be identified and used permanently. The chip carrier can also then be re-used for testing of further similar chips. It is thus desirable to be able to temporarily attach the semiconductor chip to the carrier in such a way that it can be readily separated after the burn-in test without mechanical damage to either the chip or the chip carrier.

In general, the burn-in test exercises or operates the chip at elevated voltage and temperature levels for an extended period of time in order to simulate the actual operation of the chip for its normal and expected lifetime in a final product. The electrical responses of the chip are also monitored and thus there is assurance that the chip will perform its operations during its expected life without failing. This procedure is well known to those familiar with the semiconductor technology.

A variety of processes and techniques have been devised and described in the art to form a temporary connection between semiconductor chips and carriers, so as to be able to readily separate the chip and the carrier after burn-in tests have been conducted. For Example:

U.S. Pat. No. 5,237,269 (Aimi et al.) issued Aug. 17, 1993, and assigned to International Business Machines Corporation, the disclosure of which is incorporated herein by reference, describes connections between circuit chips and temporary carriers for use in burn-in tests whereby the pads on a ceramic substrate are covered by an overlay of non-wettable material to which solder will not adhere whereby the overlay has an opening through which solder flows to make a restricted joint between the solder ball of the chip and the lead line of the carrier;

U.S. patent application Ser. No. 24,549, entitled "Method And Apparatus For In-Situ Testing of Integrated Circuit Chips", filed Mar. 1, 1993, (Attorney Docket No. EN9-93-001), assigned to International Business Machines Corporation, the disclosure of which is incorporated herein by reference, provides a method and apparatus for in-situ testing of integrated circuit chips whereby the electrical contacts between the semiconductor chips to be tested and those of the carrier are made by means of dendritic surfaces such that there are vertical projections between the contacts resulting in a fracturable joint;

U.S. Pat. No. 5,173,451 (Kinsman, et al.) issued Dec. 22, 1992, to Micron Technology Inc., provides for a soft bond for semiconductor dies wherein a reduced sized wire bond is used to create a readily fracturable joint to separate the chip from the carrier such that less bonding force is required to retain the lead wires to the carrier than the attachment strength of the pads on the chip;

U.S. Pat. No. 5,007,163 (Pope et al.), issued Apr. 16, 1991, to International Business Machines Corporation, the disclosure of which is incorporated herein by reference, describes a non-destructive method of performing electrical burn-in testing of semiconductor chips by making use of a eutectic mixture which remains liquid at certain temperatures for forming a readily fracturable connection;

IBM Technical Disclosure Bulletin, "Burn-In/In Situ Testing of Computer Chips", Volume 36, No. 3, pp. 229–231 (March 1993), describes burn-in testing of semiconductor chips in which no permanent connection between the chip contact and the substrate is required which results from limited area pads with smaller solder ball carrier surfaces; and IBM Technical Disclosure Bulletin, "Wafer Level Test And Burn-In", Volume 34, No. 8, pp. 401–404 (January 1992), describes burn-in testing of a wafer containing semiconductor chips on a carrier such that the contact pads between the contacts are made of two-level solder structure with a small contact area between the two levels. The two levels are comprised of high melting point solder and low melting point solder.

The methods and devices described in these aforementioned references are useful in many applications where it is desired to have detachable connections between the contacts of a carrier and chip for chip burn-in situations, but this may not be useful in all circumstances. For example, for use in testing chips for multilayer ceramic devices which have a large number of connections, in some cases up to 2,800 connections, known methods are limited and may not be usable. With this large number of connections the overall strength of the connection between the carrier and chip is relatively high which may result in damage to the chip or the carrier upon the removal of the chip from the carrier. Thus there is a need for every individual connection to be relatively weak. It may be difficult, if not impossible, for example, to design a mask with any precision that will have the needed definition for such a large number of small holes to accommodate this number of connections. It is also difficult with the required number of smaller holes to have the solder balls on the chips to be accurately positioned in the holes. The presently proposed processes and chip carrier do not require changes to the presently configured chip solder balls.

Other references have been identified which disclose a variety of techniques for providing temporary or detachable connections between two surfaces in general, or as may be applied in particular applications to semiconductor devices. These include for example:

U.S. Pat. No. 5,170,930 (Dolbear et al.), issued Dec. 15, 1992, to Microelectronics and Computer Technology Corporation, describes the use of a thermally and electrically conductive paste for making a detachable connection between two surfaces U.S. Pat. No. 4,740,099 (Philipoussi), issued Apr. 26, 1988, to Societe Nationale Industrielle Aerospatiale, describes an arrangement for temporarily soldering plates together such that they can be mechanically released. This is accomplished by restricting the areas to which the solder can be applied. The fracturable connection results from areas which are limited for the application of solder;

U.S. Pat. No. 4,526,859 (Christensen, et al.), issued Dec. 12, 1983, to International Business Machines Corporation, the disclosure of which is incorporated herein by reference, discloses a method of selectively metallizing a ceramic substrate provided with a metallization pattern using photoresist processing; and U.S. Pat. No. 4,360,142 (Carpenter et al.), issued Nov. 23, 1982, to International Business Machines Corporation, the disclosure of which is incorporated herein by reference, describes solder connections for electrically joining semiconductor devices to a supporting substrate.

IBM Technical Disclosure Bulletin, Vol. 35, No. 4A, pages 25-27 (September 1992), discloses an interposer removal tool, where an apparatus and method were developed to remove the interposers from a substrate.

Although it would appear that the teachings of these prior art references have found some usefulness in some situations and applications where a detachable connection is required, they do not provide completely satisfactory solutions for all situations, particularly where the increasing complexities and miniature size of semiconductor devices is concerned.

All similar previous removal methods of removing chips are known to cause chip damage and/or reliability concerns. This invention however covers apparatus and process developed to remove die or chip from a surrogate substrate or chip carrier without any damage to either.

It is therefore desirable to provide a new process and apparatus to separate a chip from its temporary chip carrier after the burn-in process or testing of the chip has taken place, which has not been described in the aforementioned art. This invention results in beneficial and practical testing of chips and readily permits the identification of those chips which may be defective and those which are good and can be used in final products.

It is also desirable to provide a new semiconductor chip carrier which can be re-used in the testing and identification of defective and good chips. This invention allows the safe removal of semiconductor devices which are sometimes called known-good-die (KGD) after they have been burnt-in and/or tested.

PURPOSES AND SUMMARY OF THE INVENTION

It is one purpose of the present invention to provide a novel apparatus and process of removing a structure, such as a semiconductor chip, from another structure, such as a semiconductor chip carrier, without damage to either of the structures.

Another purpose of this invention which is found to be particularly useful is its application in the burn-in testing of semiconductor chips, and this invention may be useful in other applications, such as, where there is a need for removing a structure that is secured to another structure.

Still another purpose of this invention is to provide a connection between a chip and a carrier, which connection can be readily reflowed and both the carrier and the chip may be re-used many times.

Therefore, in one aspect this invention comprises a process for separating an active or passive device from a device carrier, said process comprises:

(a) securing a removing means to said device, wherein said device is secured to said device carrier by at least one solder ball, (b) placing said device carrier alongwith said device and said removing means onto a housing such that said removing means provides a pulling motion to said device, (c) placing said housing in a thermal environment and heating said device until said solder reaches the solder liquidus temperature, whereupon said removing means pulls said device away from said device carrier, thereby separating said device from said device carrier.

In another aspect this invention comprises an apparatus for separating an active or passive device from a device carrier, said apparatus comprises:

(a) a separating means for separating fusible electrical connections that electrically connect said device to said device carrier, wherein said separating means is secured to said device, (b) a means for holding said device carrier alongwith said device and said separating means and forming an assembly, such that said separating means provides a pulling motion to said device, (c) placing said assembly in a thermal environment and heating said assembly until said electrical connections reach the liquidus state, whereupon said separating means pulls said device away from said device carrier, thereby separating said device from said device carrier.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Typically, a chip is mounted on a chip carrier and then tested and/or burned-in to make sure that the chip is a good chip, this is also known in the industry as KGD or Known Good Die. Once it has been established that the chip is a KGD then the chip must carefully be removed from the chip carrier and be placed on its permanent or intended substrate. Therefore, extreme care must be used to make sure that neither the chip nor the chip carrier are damaged in any way.

Typically, the KGDs are chip that are to be placed in a rugged environment or are to be placed in applications which require extreme reliability, and any failure of the chip could have major problems for the user.

Figure 1:
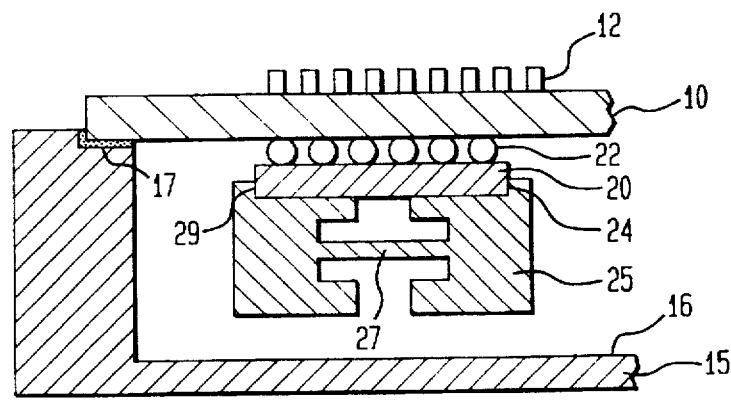
FIG. 1, illustrates one embodiment of the invention where a "H" spider design is used to remove a chip from the substrate or chip carrier.

FIG. 1, illustrates one embodiment of the invention where a "H" spider design is used to remove a first structure 20, such as an active or passive device 20, from a second structure 10, such as a semiconductor chip carrier, ceramic substrate or a multilayer ceramic substrate (hereafter collectively referred to as simply a chip carrier), that are electrically connected by solder electrical connections 22. Typically, the device 20, is first secured to the device carrier 10, via a plurality of electrical connections 22, such as, solder balls, C4s, solder column connections, to name a few. The chip carrier 10, has on one side means to electrically connect to the electrical connections 22, and on the opposite side has electrical connection means 12, such as pins 12.

A chip removal means 25, such as a "H" spider 25, is secured to the backside of the chip 20, such that the inner peripheral edges or lips 29, of the chip removal means 25, secure or grasp the outer peripheral edges 24, of the chip 20. Typically, the chip removal means 25, has tension means 27, to allow the grasping of the chip peripheral edges 24. The tension means 27, could be an integrated I-beam 27, as shown in FIG. 1, or it could be one or more springs or other tension generating means 27, that are secured to each leg of the chip removal means 25. Basically, this clamping method achieves clamping of the device or chip utilizing a bending beam approach. Clamping force is achieved by torsional deflection of the bending beam 27.

Once the chip 20, is securely held by the chip removal means 25, the substrate 10, is then placed on the ledge 17, of the fixture or housing 15, such that the chip carrier 10, is oriented with the chip 20, facing downwards. The housing or fixture 15, along with the chip carrier 10, chip 20 and chip removal fixture 25, are then typically placed in a thermal environment which will assist in raising the temperature of the solder connections 22, to its liquidus state, such as, an oven or furnace. The temperature of the oven is then slowly raised so that the temperature of the solder connection 22, is raised to its liquidus state, so that weight or pull of the chip removal tool 25, pulls the chip 20, from the chip carrier 10, and the chip 20, alongwith the chip removal tool 25, falls on the floor or surface 16, of the fixture 15. Basically, at liquidus the gravitational force of the H spider clamp 25, overcomes the force of solder surface tension and thereby removal of device or chip 20, is accomplished.

In most cases it was seen that a portion of the solder connection 22, remained attached to the chip 20, after device removal is accomplished, while the rest of the solder electrical connection 22, remained attached to the chip carrier 10. In any event, the solder site at both solder site locations, such as, on the chip 20, and the chip carrier 10, can be site dressed after device removal has been accomplished by methods well known in the art, such as, for example, U.S. Pat. No. 5,219,520 (Brofman, et al.) or U.S. Pat. No. 5,284,286 (Brofman, et al.) etc., assigned to the assignee of the instant patent application, and the disclosures of which is incorporated herein by reference, which discloses a method of site dressing.

Care should be taken that there is sufficient clearance between the chip removal means 25, and the housing floor 16, so that when the chip removal means 25, separates and falls on the housing floor 16, there is no physical connection between the chip 20, and the chip carrier 10.

For some applications prior to reflow the weight 25, could be attached to the device or chip 20, using a high temperature adhesive. In the preferred embodiment the substrate 10, and the chip 20, should be oriented in an upside down position during reflow. Once the mechanism 25, is attached to the device 20, the entire assembly should be loaded into the reflow furnace and the solder connections 22, should be slowly made to reach their liquidus stage. Upon reaching liquidus the gravitational force of the weight 25, automatically overcomes the force of solder surface tension and thereby device or chip removal is accomplished.

Figure 2A:
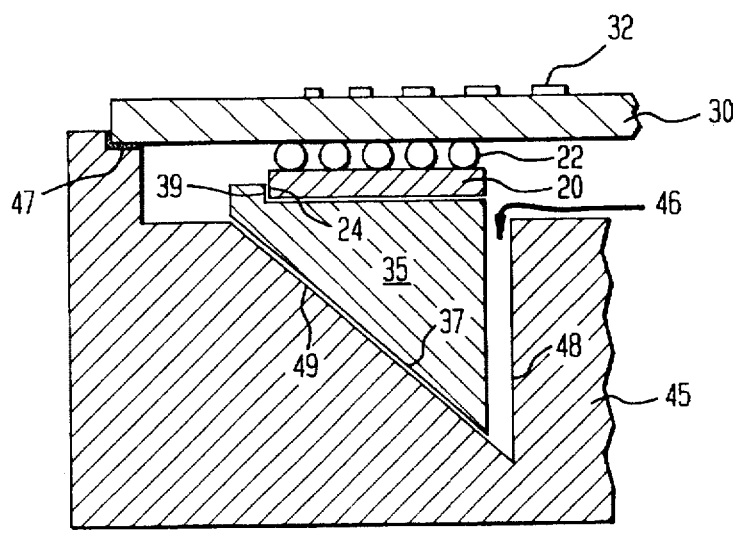
FIGS. 2A and 2B, illustrate another embodiment of the invention where a sliding weight is used to remove a chip from a substrate or chip carrier.
Figure 2B:
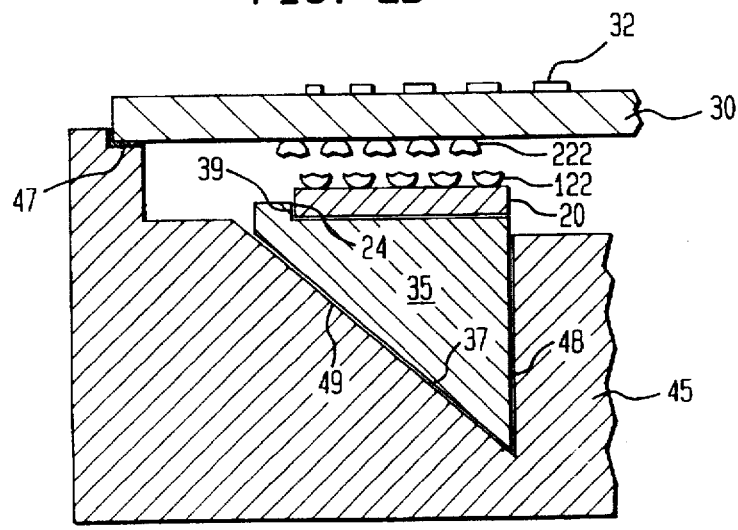

FIGS. 2A and 2B, illustrate another embodiment of the invention where a sliding weight 35, is used to remove a chip or device 20, from a device or chip carrier 30. Typically, the chip 20, is first secured to the chip carrier or substrate 30, via a plurality of electrical connections 22, such as, solder balls, C4s, solder column connections, to name a few. On the opposite surface the chip carrier 30, normally has electrical connections 32, such as, pads 32. The chip 20, is then tested and/or burned-in to make sure that the chip 20, is a good chip, this is also known in the industry as KGD or Known Good Die.

Once it has been established that chip 20, is a KGD then the chip must carefully be removed from the chip carrier and it should be site-dressed and prepared appropriately to be placed on its permanent or intended substrate. Therefore, extreme care must be used to make sure that neither the chip nor the chip carrier are damaged in any way.

For this embodiment the clamping means or sliding weight 35, is wedged between the chip 20, and the housing or fixture 45, as shown in FIGS. 2A and 2B. Lip or ledge 39, of the sliding weight 35, securely aligns and secures the peripheral edge 24, of the chip 20, and typically holds on to the chip 20, through friction. This whole assembly is then placed in an upside-down position over a fixture or housing 45, such that the edge of the chip carrier 30, rests on the ledge 47, of the housing or fixture 45. The fixture 45, has an opening 46, such that the retaining wall 48, is configured to stop the weight 35, after it has separated from the chip carrier 30, and slid along the incline or angled path 49. Similarly, the incline 49, is configured in such a way that the base 37, of the weight 35, can easily slide on the inclined path 49.

The fixture 45, along with the chip carrier 30, in its upside down position are placed in a thermal environment and the temperature is slowly raised. The temperature is typically raised to the liquidus temperature of the electrical connections 22. Upon reaching the liquidus temperature the electrical connections 22, start to break-up and forms portions 122 and 222. During this process the ledge 39, also exerts a force onto the chip 20, and helps in promoting the separation of the chip 20, from the chip carrier 30. After all the electrical connections 22, have separated the weight 35, slides down the incline 49, and comes to rest against the retaining wall 48. The fixture 45, is then removed from the thermal environment and the chip 20 and the weight 35, are removed from the fixture 45, after they have reached room or other desirable temperature. The chip 20, can be easily pulled or twisted away from the weight 35.

As stated earlier prior to reflow the wedged shaped block 35, is held in place by the chip or device 20, which is to be removed and by the inclined plane 49, of the fixture 45. The shearing force on the electrical connections 22, is achieved by the sliding of the block 35, along the inclined plane 49, of the fixture 45. It is preferred that the substrate 30, is oriented such that the chip 20, is upside down during reflow. Once the mechanism 35, is attached to the device 20, the entire assembly is loaded into a reflow furnace and the assembly is slowly heated so that the solder connections 22, could reach their liquidus. At liquidus the shear force overcomes the force of solder surface tension and the block 35, slides down the inclined plane 49, and thereby the removal of the chip or device 20, is accomplished.

Figure 3A:
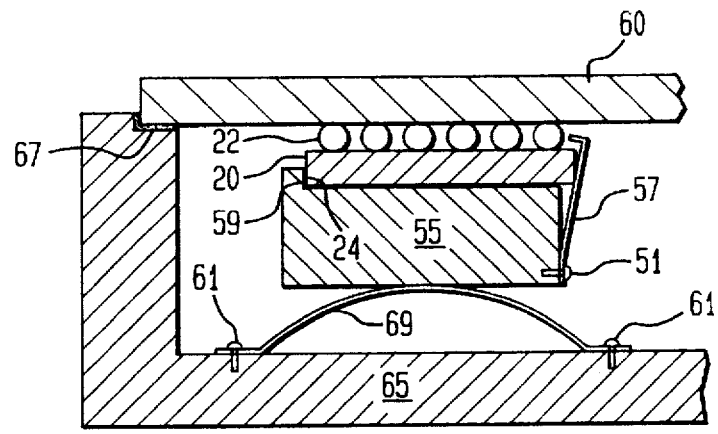
FIGS. 3A, 3B and 3C, illustrate yet another embodiment of the invention where a bi-metallic clamp design is used to remove a chip from a substrate or chip carrier.
Figure 3B:
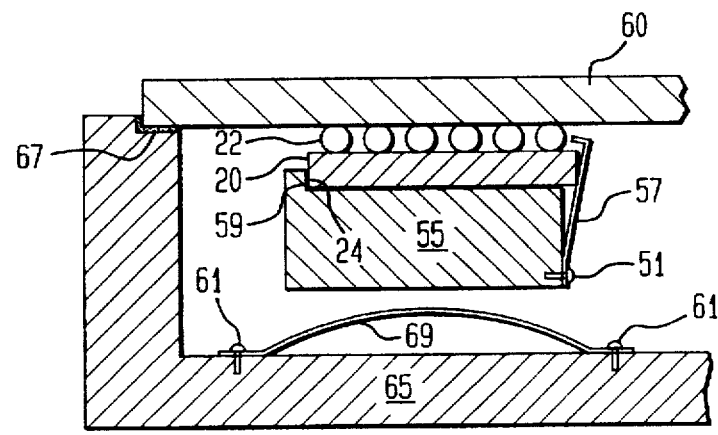
Figure 3C:
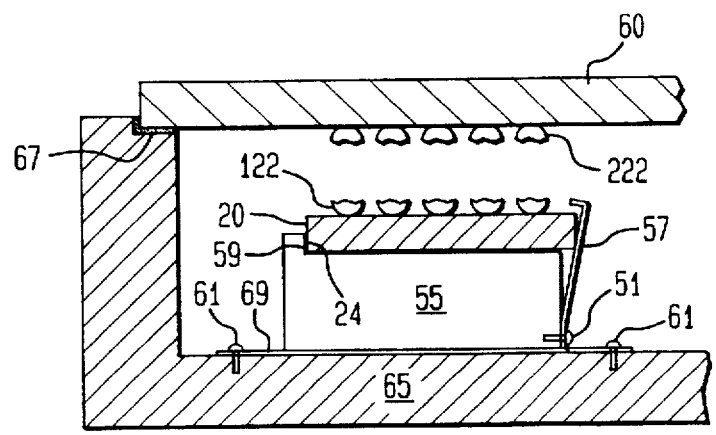

FIGS. 3A, 3B and 3C, illustrate yet another embodiment of the invention where a bi-metallic clamp design is used to remove a chip 20, from a device or chip carrier 60. A first bi-metallic clamping means 57, is secured to a chip separating or removing means 55, such as a weight 55, by retaining means 51, such as, pins, screws, etc., to name a few. Therefore, one edge 24, of the chip 20, is held securely in place by the ledge or lip 59, of the removing weight 55, while a second edge 24, is held in place by the clamping means 57.

The clamping means 57, is typically away from the peripheral edge 24, of the chip 20, but when it is heated the clamping means 57, moves closer and makes good physical contact with at least a portion of the peripheral edge 24. The chip carrier 60, is then turned upside down and the edges of the chip carrier 60, are made to rest on the peripheral edges of a fixture 65. The fixture 65, could have a ledge 67, to accommodate the edge of the chip carrier 60.

The fixture 65, also has secured to it a bi-metallic strip 69, which is secured to the fixture 65, by securing means 61, such as, pins, screws, etc., to name a few. The location of the second bi-metallic strip 69, should be such that the separating means 55, should be able to rest on it, as more clearly shown in FIG. 3A.

Upon heating the second bi-metallic strip 69, collapses, as more clearly shown in FIG. 3B, and which leaves the separating means 55, clinging on to the chip 20. Upon further heating when the electrical connection means 22, such as, solders reach their liquidus stage the second bi-metallic strip 69, collapses completely and typically lays flat on the surface of the housing 65, as seen in FIG. 3C. Also shown in FIG. 3C, is the fact that the separating means 55, has been able to completely pull the chip 20, away from the chip carrier 60.

It has been seen that in some application the electrical connections 22, will separate as electrical connections 122 and 222. The electrical connections can subsequently be removed by methods well known in the art, such as, site dressing methods already discussed elsewhere in this specification.

This bi-metallic clamping method achieves clamping of the device utilizing a bi-metallic spring 57, to clamp the device or chip 20, when the temperatures are increased. It is preferred that the substrate 60, is oriented such that the chip 20, faces downward during reflow. The clamping force is achieved by deflection of the bi-metal strip 57, which exerts force on the device or chip 20. Once the mechanism is attached to the device 20, the entire assembly is loaded into a reflow furnace and where at an elevated temperature the bi-metallic strip 57, clamps onto the device 20, while the second bimetallic strip 69, holds the block 55, in place. A further increase to liquidus temperature causes tautness of the second bimetallic strip 69, and at liquidus the gravitational force on the bi-metal mechanism overcomes the force of solder surface tension and thereby device removal is accomplished.

The preferred bi-metallic material for the first bi-metallic 57, and the second bi-metallic 69, are sold by Crest Manufacturing Company, Inc, Lincoln, R.I., USA. However, other bi-metallic materials sold by other companies would also be acceptable.

In most cases it was seen that a portion of the solder connection 22, remained attached to the chip 20, after device removal is accomplished, while the rest of the solder electrical connection 22, remained attached to the chip carrier 10, 30 or 60. In any event, the solder site at both solder site locations, such as, on the chip 20, and the chip carrier 10, 30 or 60, can be easily site dressed after device removal has been accomplished by methods well known in the art, such as, for example, U.S. Pat. No. 5,219,520 (Brofman, et al.) or U.S. Pat. No. 5,284,286 (Brofman, et al.) etc., assigned to the assignee of the instant patent application, and the disclosures of which is incorporated herein by reference, which discloses a method of site dressing.

The material for the weight or removing means could be selected from a group comprising of molybdenum, iron, tungsten, chrome, stainless steel, steel, copper, nickel, copper/tungsten, gold and alloys and mixtures thereof, to name a few. It is preferred that the weight of the removing means should be as heavy as economically possible so that it can easily pull the device or chip away from the device carrier after the fusible electrical connections reach their liquidus stage or state. One such material that has been used for the weight 25, but could also be used for the other embodiments, is Carpenter Pyromet Alloy 718, which is sold by, and is a trademark of, Carpenter Technology Corporation, Reading, Pa., USA.

This invention meets the industry's desire to be able to re-use the chip carrier many times for the burn-in and/or testing of different chips.

Similarly this invention also meets the desire to be able to remove the tested chip from the chip test carrier without damaging the chip or any of its components, such as, solder balls. As stated earlier that the tested chip that has passed the burn-in test is also known in the industry as KGD or Known Good Die.

It should be noted that the temporary electrical connections that electrically connect the chip carrier and the chip are of such a nature that they do not interfere with the chips burn-in and/or test procedures.

However, the temporary electrical connection between the chip and the substrate are mechanically weak. This is due to the fact that the chip after the burn-in and/or test should be easily removable using the apparatus and process of this invention without damaging either the chip or the chip carrier.

For those chips which have passed the test and are without any defects and have been site dressed can then be permanently mounted on a device for incorporating into a product. However, those chips in which defects are identified must either be discarded or used in another products where the use of the defective chip would be acceptable. The chip carrier however should be rugged enough so that it can be used over and over many times for carrying out subsequent burn-in and/or other tests on other similar chips.

Incorporating the process and apparatus described in this specification has been found to be very useful and practical. It is also an economical way of identifying those chips which should not be incorporated in finished products, thus resulting in being able to more economically manufacture semiconductor devices.

The preferred method of this invention is to utilize a furnace to achieve solder reflow temperatures so that the force of the weight overcomes the liquidus solder surface tension of the solder interconnections.

The fusible connections, such as, electrical connections 22, are typically, solder balls or C4 (Controlled Collapse Chip Connection) or solder column connection, etc., to name a few. The liquidus temperature of these fusible connections vary depending upon the materials used and their stoichiometry.

The driving force behind this KGD invention is the market requirement to provide known good dies prior to device attachment on multi-chip modules (MCM).

For some applications a thin layer of an adhesive could be applied between the chip or device and the clamping means or sliding weight. The preferred adhesive is an adhesive that can withstand high temperatures or at least the temperature required to reach the liquidus temperature for the electrical connection. The adhesive that may be present on the surface of the chip or device and/or the weight is typically removed using solvents that are well known in the art.

However, it should be noted that while the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for separating an active or passive device from a device carrier, said apparatus comprises:

(a) a separating means for separating fusible electrical connections that electrically connect said device to said device carrier, wherein said separating means is secured to said device, (b) a means for holding said device carrier along with said device and said separating means and forming an assembly, such that said separating means provides a pulling motion to said device, (c) placing said assembly in a thermal environment and heating said assembly until said electrical connections reach the liquidus state, whereupon said separating means pulls said device away from said device carrier, and (d) means for securing at least a portion of at least one strip to said separating means, and wherein at least a portion of said strip is in contact with said device, and wherein said at least one strip clamps onto said device when said strip is heated, thereby separating said device from said device carrier.

2. The apparatus of claim 1, wherein the material for said separating means is selected from the consisting of molybdenum, tungsten, chrome, iron, stainless steel, steel, nickel, copper, gold, copper/tungsten and alloys thereof.

3. The apparatus of claim 1, wherein at least one first bimetallic strip supports said separating means prior to said assembly being placed in said thermal environment.

4. The apparatus of claim 3, wherein at least one second bimetallic strip is secured to said separating means.

5. The apparatus of claim 3, wherein at least one second bimetallic strip is secured to said separating means and wherein said at least one second bimetallic clamps said device when said device is heated.

6. The apparatus of claim 1, wherein said separating means has at least one ledge to align and secure one edge of said device.

7. The apparatus of claim 1, wherein said fusible electrical connections between said device and said device carrier are selected from the group comprising solder balls, C4s and solder column connections.

8. The apparatus of claim 1, wherein said strip is at least one bimetallic strip.

* * * * *